(12) United States Patent
Shimogawa et al.

(10) Patent No.: US 7,885,130 B2
(45) Date of Patent: Feb. 8, 2011

(54) SEMICONDUCTOR INTEGRATED CIRCUIT

(75) Inventors: Kenjyu Shimogawa, Kanagawa (JP);
Hiroshi Furuta, Kanagawa (JP)

(73) Assignee: Renesas Electronics Corporation,
Kanagawa (JP)

( * ) Notice: Subject to any disclaimer, the term of this patent is extended or adjusted under 35 U.S.C. 154(b) by 23 days.

(21) Appl. No.: 12/502,402

(22) Filed: Jul. 14, 2009

(65) Prior Publication Data

US 2010/0034040 A1    Feb. 11, 2010

(30) Foreign Application Priority Data

Aug. 7, 2008    (JP) .............................. 2008-204509

(51) Int. Cl.
*G11C 7/00*    (2006.01)
(52) U.S. Cl. .............. 365/205; 365/189.11; 365/230.06
(58) Field of Classification Search .................. 365/205,
365/208, 189.11, 230.06
See application file for complete search history.

(56) References Cited

U.S. PATENT DOCUMENTS 6,307,807 B1 * 10/2001 Sakui et al. ............... 365/238.5

| | | | | |
|---|---|---|---|---|
| 6,370,081 B1 * | 4/2002 | Sakui et al. | ............... | 365/238.5 |
| 7,289,371 B2 * | 10/2007 | Ohta | ..................... | 365/189.16 |
| 7,301,809 B2 * | 11/2007 | Sakui et al. | ............. | 365/185.05 |
| 2007/0133283 A1 * | 6/2007 | Sakui et al. | ............. | 365/185.05 |

FOREIGN PATENT DOCUMENTS

| JP | 08-095686 | 4/1996 |
|---|---|---|
| JP | 09-251336 | 9/1997 |
| JP | 2003-272390 | 9/2003 |
| JP | 2004-133961 | 4/2004 |
| JP | 2007-157283 | 6/2007 |

* cited by examiner

*Primary Examiner*—Gene N Auduong
(74) *Attorney, Agent, or Firm*—Young & Thompson

(57) ABSTRACT

A semiconductor integrated circuit according to an exemplary embodiment of the present invention includes a plurality of memory cells connected to one word line; a plurality of sense amplifier circuits that are connected to the memory cells and divided into an N number of groups; and N number of data inversion processing circuits that respectively receive data read out from the N number of groups of sense amplifier circuits, in which after a sense amplifier circuit of a first group terminates operation, a sense amplifier circuit of a second group different from the first group operates, and each of the data inversion processing circuits performs data inversion processing based on the data read out from each of the groups of sense amplifier circuits, and outputs the data to an output terminal of each of the data inversion processing circuits.

9 Claims, 3 Drawing Sheets

SEMICONDUCTOR INTEGRATED CIRCUIT

BACKGROUND

1. Field of the Invention

The present invention relates to a semiconductor integrated circuit, and more particularly, to a semiconductor integrated circuit including a sense amplifier (hereinafter abbreviated as "SA") that operates when multiple bits of memory cells connected to a single word line (W line) are simultaneously read out.

2. Description of Related Art

Japanese Unexamined Patent Application Publication Nos. 2003-272390 (Honda), 2007-157283 (Shimada), and 08-095686 (Toma) disclose operation of SAs in the case where multiple cells connected to a single W line are simultaneously read out. Honda discloses a configuration in which cells are divided into a plurality of groups to form a plurality of SA groups. The SA groups start to operate at different timings, instead of starting to operate at the same time, thereby reducing a peak current occurring during the operation of the SAs. In addition, according to a technique disclosed by Shimada, SAs are divided into a plurality of SA groups, and the operation timings of the SA groups are shifted from each other in synchronization with a clock. This results in a decrease in peak current occurring during the operation of the SAs.

Meanwhile, as a method for reducing an output circuit current itself, there is known a technique for inverting output data to be transmitted to a communication counterpart (receiving side) according to an interface at the receiving side. As a technique for transmitting one of a signal having a level of "H" and a signal having a level of "L" with higher priority in the data transmission, there is known a technique for terminating a terminal at a transmitting side.

In this regard, in the case of data transmission when a bus (output terminal) is pulled up to the "H" level, for example, the "inversion" of the output data requires less operating current as the number of bits having a logical value "1" is increased in the data to be transmitted. Accordingly, when the number of bits having a logical value "0" is greater than the number of bits having the logical value "1" in the data, the data is transmitted after the logical value thereof is inverted to "1". During that time, <flag data: 1 bit> indicating that the data is inverted is transmitted at the same time to notify the receiving side of the transmission of the inverted data. Thus, one terminal for transmitting the flag data needs to be provided on the transmitting device side. One such technique is disclosed by Toma.

Furthermore, as a technique of data inversion, Japanese Unexamined Patent Application Publication No. 09-251336 (Takashima) discloses a technique for performing data inversion by dividing data to be transmitted. Japanese Unexamined Patent Application Publication No. 2004-133961 (Yoshida et al.) discloses a technique in which data of a given cycle is compared with output data of the previous cycle and when multiple bits are inverted among all the bits, the data of the given cycle is inverted to be output.

In the related art, as a method for reducing an operating current at the time of reading out multiple bits at the same time, there are known techniques for reducing the operating current in the individual circuits or operations, such as a technique for dividing SAs into groups to be operated and a technique of data inversion. However, there is no prior art technique for reducing an operating current throughout a read operation.

For example, in the case where multiple cells connected to a selected W line are read out at the same time, namely in the case where multiple bits are transmitted from an output terminal at the same time, it has not been known how SAs are divided into groups to be operated and how data transmitted from the SAs which are divided into groups to be operated are subjected to data inversion processing. Moreover, it has not been known the overall optimal configuration.

SUMMARY

The present inventor has found a problem that there is no prior art technique for reducing an operating current throughout a read operation.

A first exemplary aspect of an embodiment of the present invention is a semiconductor integrated circuit including: a K (K is a natural number greater than or equal to 2) number of memory cells that are connected to one word line; a plurality of sense amplifier circuits that are connected to the memory cells and divided into an N (N is a natural number greater than or equal to 2) number of groups; and an N number of data inversion processing circuits that respectively receive data read out from the N number of groups of sense amplifier circuits. In the semiconductor integrated circuit, after a sense amplifier circuit of a first group terminates operation, a sense amplifier circuit of a second group different from the first group operates, and each of the N number of data inversion processing circuits performs data inversion processing based on the data read out from each of the groups of sense amplifier circuits, and outputs the data to an output terminal of each of the data inversion processing circuits.

This prevents the plurality of sense amplifier groups from operating at the same time during the stable operation of the sense amplifiers. As a result, it is possible to prevent a superimposed current from being generated. Furthers the data inversion processing is carried out on data for each of the divided SA groups to be operated (for each SA group). Consequently, the "occurrence rate" of desired data is increased, and the output circuit current can be reduced on average, compared to the case where the data inversion processing is carried out on all the bits at the same time.

According to an exemplary embodiment of the present invention, it is possible to provide a semiconductor integrated circuit capable of reducing an operating current throughout a read operation.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
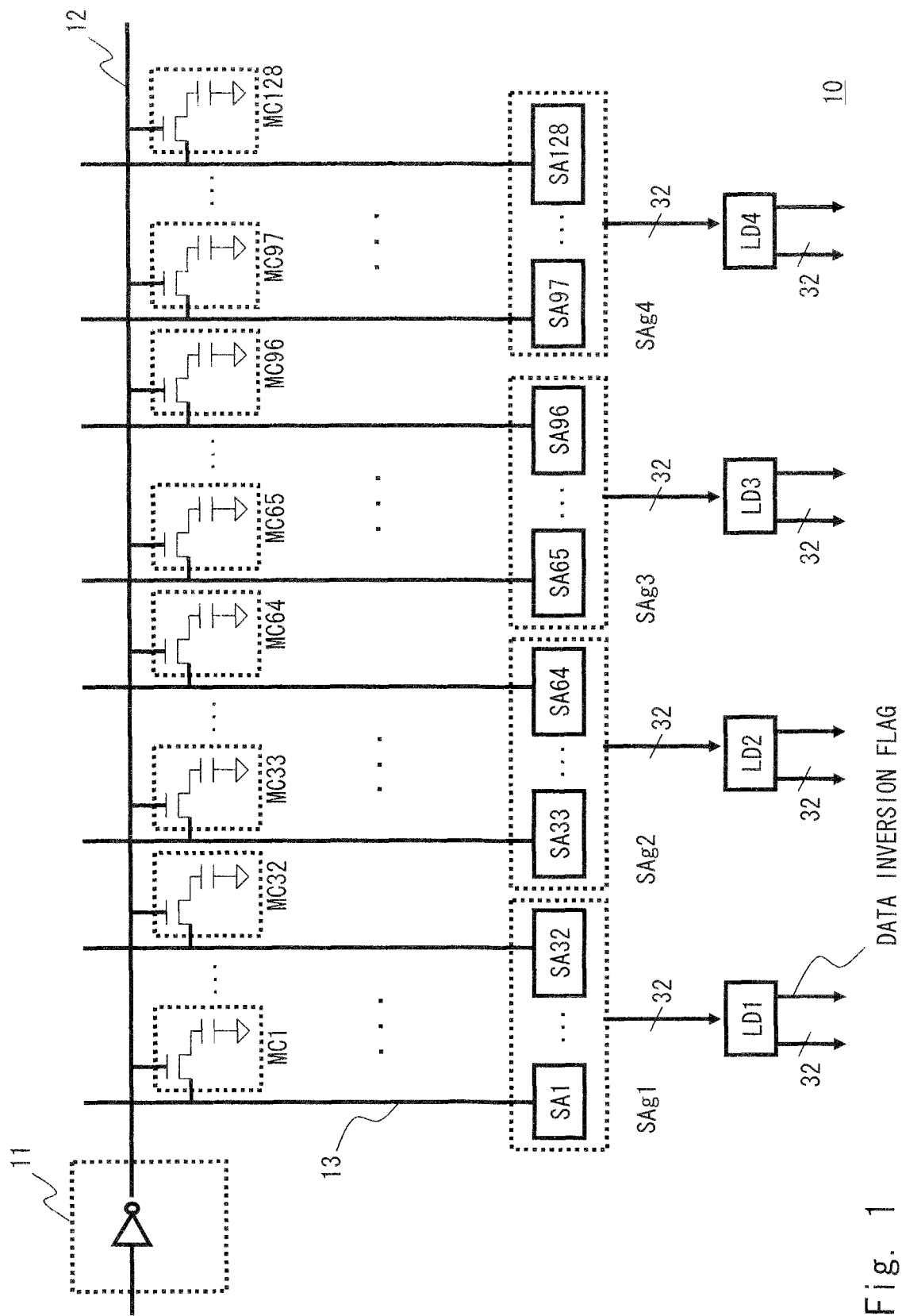
FIG. 1 is a diagram showing the configuration of a semiconductor integrated circuit according to a first exemplary embodiment of the present invention.

Referring to FIG. 1, the configuration of a semiconductor integrated circuit according to a first exemplary embodiment of the present invention will be described. FIG. 1 is a diagram showing the configuration of a semiconductor integrated circuit 10 according to this exemplary embodiment. An example of a memory cell array including 128 cells (bits) connected to a single word line (W line) is described herein. Note that the individual cells are not shown in FIG. 1. The number of memory cells of a DRAM is equal to the number of sense amplifiers.

The semiconductor integrated circuit 10 according to this exemplary embodiment includes a W-line driver circuit 11, a W line 12, a plurality of bit lines 13, memory cells MC1 to MC128, and sense amplifiers SA1 to SA128. The W-line driver circuit 11 is connected to the W line 12. The W line 12 and the plurality of bit lines 13 are arranged so as to cross each other. In the exemplary embodiment shown in FIG. 1, 128 bit lines 13 are provided to correspond to the number of memory cells.

The memory cells MC1 to MC128 are arranged at intersections between the W line 12 aid the plurality of bit lines 13. Each of the memory cells includes a transistor and a capacitor. The gate of the transistor is connected to the W line 12. One of the source and drain of the transistor is connected to one of the plurality of bit lines 13, and the other of the source and drain thereof is connected to the capacitor. The memory cells are respectively called MC1, MC2, . . . , and MC128 from the side closest to the W-line driver circuit 11, for ease of explanation. The plurality of bit lines 13 are respectively connected to the sense amplifiers SA1 to SA128.

In this exemplary embodiment, four SA groups each including 32 cells are provided. The SA groups are respectively called SAg1, SAg2, SAg3, and SAg4 from the side closest to the W-line driver circuit 11. The SAg1 is connected to the memory cells MC1 to MC32; the SAg2 is connected to the memory cells MC33 to MC64; the SAg3 is connected to the memory cells MC65 to MC96; and the SAg4 is connected to the memory cells MC97 to MC128. The plurality of SAs provided in the SA groups SAg1 to SAg4 are independently activated by SA activation signals SEg1 to SEg4, respectively.

The SA groups read out data in response to the activation signals. A method of activating each of the SA groups is as follows First, the SAg1 is activated to read out data. After the SAg1 has finished reading out data, the SAg2 is activated to read out data. Then, in a similar manner as described above, the SAg3 and SAg4 are subsequently activated after the activation of the previous SA group is finished.

In this manner, in the semiconductor integrated circuit 10 according to this exemplary embodiment, the SAgs (SA groups) are sequentially activated one by one. In other words, there occurs no period of time during which a plurality of SA groups are simultaneously activated. Thus, only a peak operating current and operation stabilizing current for use in activating one SA group are consumed. This results in a decrease in peak current as well as SA operation stabilizing current.

The reason why the SA groups are sequentially activated in the order from the SAg1, which is the SA group disposed on the side closest to the W-line driver circuit 11, toward the SAg group disposed on the side farthest from the W-line driver circuit 11 is as follows That is, immediately after the W line to which multiple cells are connected is selected, a potential difference is generated between a portion of the W line 12 close to the W-line driver circuit 11 and a portion of the W line 12 far from the W-line driver circuit 11. The potential of the W line 12 corresponds to the gate potential of a selection transistor, and thus it is desirable that the W line 12 be set to a predetermined potential. The potential of the portion of the W line 12 close to the W-line driver circuit 11 reaches the predetermined potential earlier than the portion of the W line 12 far from the W-line driver circuit 11. Accordingly, in the case where the SA groups read out data, the SA groups are sequentially activated from the SA group disposed on the side closest to the W-line driver circuit 11, thereby achieving a stable read operation.

Data is output from each. SA group to each data inversion processing circuit (hereinafter referred to as "LD"). Each data inversion processing circuit determines a logical value of the received data and performs data inversion processing as described below. In this exemplary embodiment, four LDs (LD1 to LD4) are incorporated as shown in FIG. 1. The SA groups SAg1 to SAg4 are connected to the LD1 to LD4, respectively.

Each of the LDs determines which of the number of bits having a logical value "1" and the number of bits having a logical value "0" is greater in the received data, and processes the data based on the determination results in accordance with a predetermined rule. It is assumed herein that: a data transmission bus is pulled up; a terminal level of an output terminal is "H" level; and processing for increasing the number of bits having the logical value "1" is carried out.

Specifically, assuming that n bits having the logical value "1" are included in 32–bit data and the remaining bits having the logical value "0" are represented by (32–n bits) in each of the SA groups, when n=32–n is satisfied, data inversion processing is not carried out. Meanwhile, when n<32–n is satisfied, the data inversion processing is carried out. When the data inversion processing is performed for each of the plurality of groups in a manner as described above, the "occurrence rate" of desired data (e.g., "1" in this exemplary embodiment) is increased. In other words, when the data inversion processing is carried out on each of the plurality of divided groups, the probability or performing the data inversion processing on the desired data is increased, compared to the case where the data inversion processing is performed depending on the number of desired data items in 128 bits of the entire memory cells.

The LD1 outputs 33 bits of data in total including 32 bits obtained after the data inversion processing and one data inversion flag bit. The other LDs, namely, LD2 to LD4 are also processed in a similar manner and output 33-bit data.

The flag bit can be determined such that "1" is transmitted when data is inverted and "0" is transmitted when data is not inverted, for example. The semiconductor integrated circuit 10 outputs (32+1)×4=132 bits in total. In this case, the device includes 128+4 output terminals.

Figure 2:
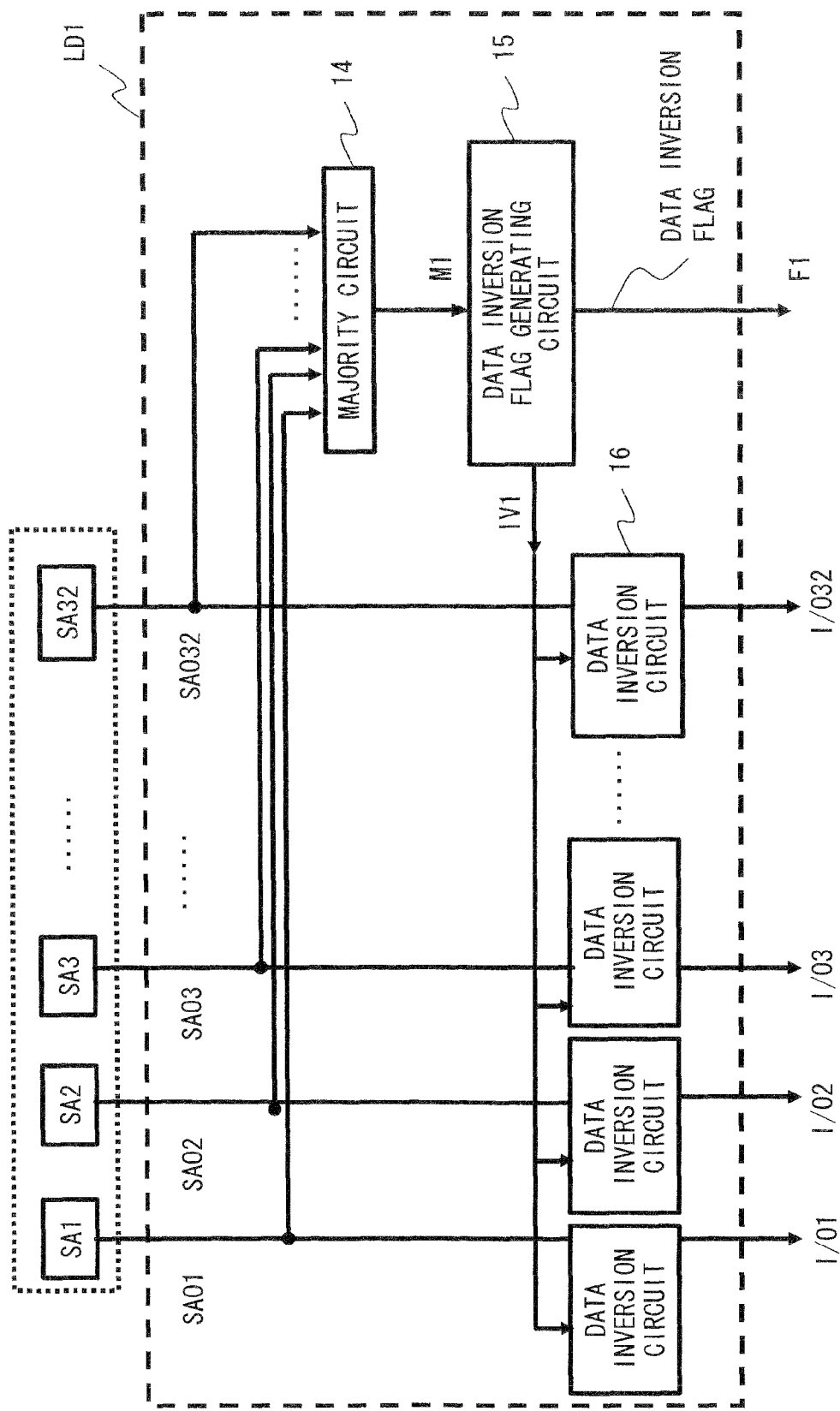
FIG. 2 is a partial sectional view showing the configuration of the semiconductor integrated circuit according to the first exemplary embodiment.

Referring now to FIG. 2, the configuration of one of the data inversion processing circuits (LDs) will be described FIG. 2 is a diagram showing the configuration of the LD1 incorporated in the semiconductor integrated circuit according to this exemplary embodiment. Note that the LD2 to LD4 have the same configuration as that of the LD1, so the description thereof is omitted As shown in FIG. 2, the LD1 includes a majority circuit 14, a data inversion flag generating circuit 15, and data inversion circuits 16. The majority circuit 14 receives output signals SAO1 to SAO32 from the SA1 to SA32. The majority circuit 14 determines which of the number of bits having the logical value "1" and the number of bits having the logical value "0"

is greater in the received output signals SAO1 to SAO32. That is, the majority circuit 14 determines whether the number of output signals indicating "1", i.e., a high level is 32/2=16 or greater, and outputs a determination signal M1.

The determination signal M1 output from the majority circuit 14 is input to the data inversion flag generating circuit 15. The data inversion flag generating circuit 15 transmits an inversion signal IV1 to each of the data inversion circuits 16 based on the determination signal M1, and generates a flag signal F1.

As described above, when the terminal level of the output signal is "H" level, the transmission of data having the logical value "1" requires less operating current. The data inversion flag generating circuit 15 performs data inversion processing for each SA group when n<32-n is satisfied, namely, when the number of bits having the logical value "1" is smaller than the number of bits having the logical value "0", so that the operating current can be reduced. Meanwhile, when n=32-n is satisfied, namely, when the number of bits having the logical value "1" is greater than the number of bits having the logical value "0", the data inversion flag generating circuit 15 performs no data inversion processing. The data inversion circuits 16 perform inversion processing on the output signals SAO1 to SAO32 in response to the received inversion signal IV1 arid output I/O1 to I/O32, respectively.

Note that when the data transmission bus is pulled down and the terminal level of the output terminal is "L" level, the transmission of data having the logical value "0" requires less power consumption. In this case, the inversion processing is carried out on the output signals SAO1 to SAO32 so that the number of bits having the logical value "0" is greater than the number of bits having the logical value "1".

Figure 3:
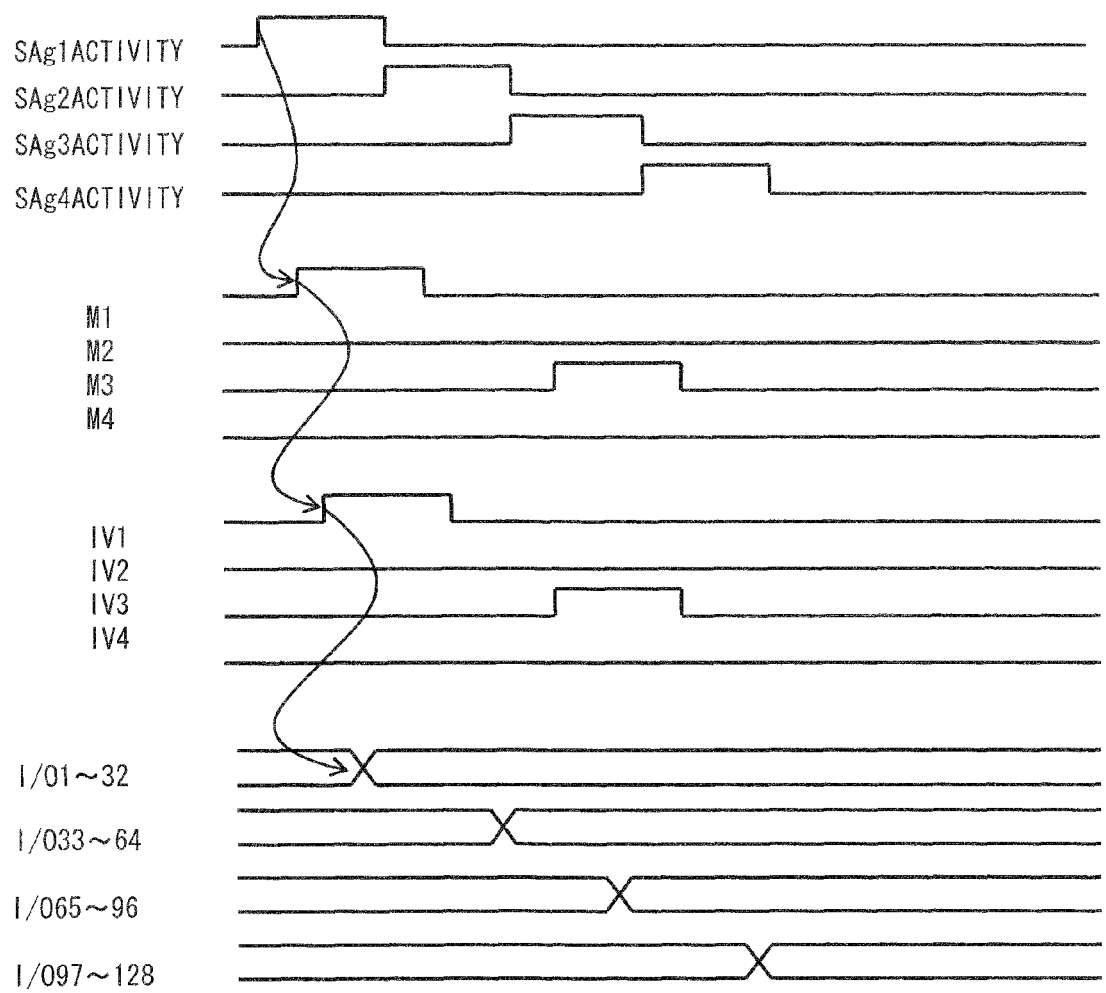
FIG. 3 is a timing diagram illustrating operation of the semiconductor integrated circuit according to the first exemplary embodiment.

Referring now to FIG. 3, operation of the semiconductor integrated circuit according to this exemplary embodiment will be described in detail. FIG. 3 is a timing diagram in the data inversion processing circuits of the semiconductor integrated circuit according to this exemplary embodiment. Note that, in the exemplary embodiment shown in FIG. 3, the terminal level of the output terminal is "L" level and the inversion processing is performed so that the number of bits having the logical value "0" is greater than the number of bits having the logical value "1".

First, during the activation of the SAg1 ("H" level period) shown in FIG. 3, the SA1 to SA32 shown in FIG. 2 are activated to start data output. The output signals SAO1 to SAO32 are input to the majority circuit 14. The majority circuit 14 determines which of the number of bits having the logical value "1" and the number of bits having the logical value "0" is greater in the output signals SAO1 to SAO32.

FIG. 3 shows the case where the number of data "1" is greater than the number of bits having the logical value "0" in the output signals SAO1 to SAO32. In this case, as described above, when the terminal level of the output level is "L" level and the number of bits having the Logic a value "1" is greater than the number of bits having the logical value "0", the inversion processing is performed so that the number of bits having the logical value "0" is greater than the number of bits having the logical value "1". The majority circuit 14 outputs the determination signal M1 ("H" level signal) indicating that the number of bits indicating the logical value "1" is greater than the number of bits having the logical value "0" in the output signals SAO1 to SAO32. When the determination signal M1 is input to the data determination flag generating circuit 15, the data determination flag generating circuit 15 transmits the inversion signal IV1 to each of the data inversion circuits 16, and generates the flag signal F1.

Then, the data inversion circuits 16 perform inversion processing on the output signals SAO1 to SAO32 in response to the received inversion signal IV1 and output the I/O1 to I/O32, respectively. After the activation of the SAg1 is finished, the SAg2 is then activated. As shown in FIG. 3, when the number of bits having the logical value "0" is greater than or equal to "1" in output signals SAO33 to SAO64, a determination signal M2 is not at "H" level. Accordingly, a flag signal IV2 is not at "H" level, either. In this case, the inversion processing is not carried out, and the output signals SAO33 to SAO64 are output as I/O33 to I/O64. Then, in a similar manner as described above, the output signals are determined and the inversion processing and generation of flag signals are carried out.

Note that the number of cells included in one SA group (the number of cells of a DRAM is equal to the number of SAs) is determined based on the peak current at the start of operation and the current generated during the stable operation according to product specs. While the number of SA groups is four in this exemplary embodiment, the number of SA groups is riot limited thereto. As the number of SA groups is increased, the access speed decreases, resulting in a decrease in power consumption. As the number of SA groups is reduce, the access speed increases, resulting in an increase in power consumption. The configuration can be determined based on the number of cells connected to a single W line 12 to be simultaneously read, and the product specs such as the access speed and power consumption.

Further, when the number of groups (the number of circuits) for performing the data inversion processing is increased, the "occurrence rate" of desired logical data is increased and the output circuit current can be reduced. In this case, however, the number of terminals for the data inversion flag bit needs to be increased. As the number of terminals increases, the chip area also increases. Therefore, it is necessary to determine the number of data inversion processing circuits in view of the increase in the number of terminals and the increase in chip size, for example.

Next, the efficiency of the data inversion processing will be described. First, from the viewpoint of a decrease in output current, it is desirable to constantly transmit data having the logical value "1" or "0" as much as possible. When the data bits are divided into groups of a predetermined number of bits and the data inversion processing is carried out on the predetermined number of bits, the probability (occurrence rate) of generating data having the logical value "1" or "0" as much as possible is increased, compared to the case where the data inversion processing is carried out on all the bits at the same time. As a result, the output circuit operating current can be reduced on average.

In the case where DRAM cells of 128 bits are connected to a single W line 12 and the cells are divided into four groups to be read out, when each of the groups includes 32 bits like in the exemplary embodiment, the number of bits having the logical value "1" may be equal to the number of bits having the logical value "0" after the execution of the data inversion processing. In view of this, the number of memory cells belonging to each group is set to an odd number. As a result, one of the number of bits having the logical value "1" and the number of bits having the logical value "0" is inevitably greater than the other thereof.

For examples in the case of dividing the cells into four groups, the cells are divided into two groups each including 31 bits and two groups each including 33 bits. Specifically, assuming that a K number of memory cells and an N number of groups into which the sense amplifiers are divided are represented by k/N=P (P is a natural number), when P is an even number, the number of memory cells connected to each group is set to be equal to P−1 or P+1, and the number of groups connected to a (P−1) number of memory cells is set to be equal to the number of groups connected to a (P+1) number of memory cells. This prevents the number of bits having the logical value "1." from being equal to the number of bits having the logical value "0" after the execution of the data inversion processing for each group. As a result, the output current can be further reduced. Note that when P is an odd number, the number of memory cells connected to each group can be represented by P.

Further, assuming that the K number of memory cells and the N number of groups are represented by K/N=QN+r (Q and r are natural numbers; r<N), when Q is an odd number, a Q number of memory cells can be connected to an (N−1) number of groups, and a (Q+r) number of memory cells can be connected to the remaining one group. Meanwhile, when Q is an even number, a (Q−1) number of memory cells are connected to an [(N−1)/2] number of groups among the groups, and a (Q+1) number of memory cells are connected to an [N/2] number of groups. Additionally, the (Q+r) number of memory cells can be connected to the remaining one group It is assumed herein that [A] denotes Gauss's notation and is a maximum integer not exceeding A.

Assuming that the N number of groups is 6, for example, the (Q+1) number of memory cells are connected to [(6−1)/2]=2 number of groups, and the (Q+1) number of memory cells are connected to [6/2]=3 number of groups. Additionally, the (Q+r) number of memory cells are connected to the remaining one group. In a similar manner, when the N number of groups is 7, [(7−1)/2]=3 and [7/2]=3 are established. With respect to the remaining one group, the memory cells can be connected to the SAs of each group. In this manner, the number of groups connected to an odd number of memory cells is set to be greater than the number of groups connected to an even number of memory cells, resulting in a decrease in output current.

As described above, in an exemplary embodiment of the present invention, when a plurality of memory cells to be read out at the same time are connected to a single W line 12, the sense amplifiers that are operated at the same time are divided into a plurality of groups. After the operation of one sense amplifier group is finished, the subsequent sense amplifier group is caused to operate. Thus, according to an exemplary embodiment of the present invention, a plurality of sense amplifier groups are not activated simultaneously. This results in a decrease in read-out current.

Further, the data inversion processing is carried out on data for each of the divided SA groups to be operated (for each SA group). Accordingly, compared to the case where the data inversion processing is carried out on all the bits at the same time, the output circuit current can be reduced on average. It goes without saying that the operating current is reduced when the data inversion processing is performed for each of the divided SA groups, compared to the case where the data inversion processing is performed on all the bits at the same time.

Furthermore, the data inversion processing is carried out on an odd number of sets of data. This results in a further decrease in output current. Moreover, the SA groups are sequentially activated in the order from the SA group disposed on the side closest to the W-line driver circuit 11 toward the SA group disposed on the side farthest from the W-line driver circuit 11. This enables a stable read operation from the memory cells.

While the Invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
a K (K is a natural number greater than or equal to 2) number of memory cells that are connected to one word line;
a plurality of sense amplifier circuits that are connected to the memory cells and divided into an N (N is a natural number greater than or equal to 2) number of groups; and
an N number of data inversion processing circuits that respectively receive data read out from the N number of groups of sense amplifier circuits, wherein
after a sense amplifier circuit of a first group terminates operation., a sense amplifier circuit of a second group different from the first group operates, and subsequent sense amplifier circuits sequentially operate before a sense amplifier circuit of an n-th group operates, and
each of the N number of data inversion processing circuits performs data inversion processing based on the data read out from each of the groups of sense amplifier circuits, and outputs the data to an output terminal of each of the data inversion processing circuits.

2. The semiconductor integrated circuit according to claim 1, wherein
when a terminal level of the output terminal is "H" level, each of the data inversion processing circuits performs the data inversion processing so that the number of bits having a logical value "1" is greater than the number of bits having a logical value "0" in the data read out from each of the sense amplifier circuits, and
when the terminal level of the output terminal is "L" level, each of the data inversion processing circuits performs the data inversion processing so that the number of bits having the logical value "0" is greater than the number of bits having the logical value "1" in the data read out from each of the sense amplifier circuits.

3. The semiconductor integrated circuit according to claim 1, wherein each of the data inversion processing circuits has a function of generating an inversion signal indicating that data is inverted, when each of the data is inverted.

4. The semiconductor integrated circuit according to claim 3, wherein the inversion signal is transmitted to each of an N number of output terminals different from the output terminal.

5. The semiconductor integrated circuit according to claim 1, wherein the number of memory cells connected to each of the N number of groups is an odd number.

6. The semiconductor integrated circuit according to claim 1, wherein the number of groups connected to an odd number of memory cells is greater than the number of groups connected to an even number of memory cells among the N number of groups.

7. The semiconductor integrated circuit according to claim 1, wherein
assuming that the K number of memory cells and the N number of groups into which the sense amplifier circuits are divided are represented by K/N=P (P is a natural number), when the number P is an odd number, the number of memory cells connected to each of the N number of groups is represented by P, and when the number P is an even number, the number of memory cells connected to each of the N number of groups is represented by one of P−1 and P+1, and the number of groups connected to a (P−1) number of memory cells is equal to the number of groups connected to a (P+1) number of memory cells.

8. The semiconductor integrated circuit according to claim 1, wherein assuming that the K number of memory cells and the N number of groups into which the sense amplifier circuits are divided are represented by K/N=Q×N+r (Q and r are natural numbers; r<N), when the number Q is an odd number, a Q number of memory cells are connected to an (N−1) number of groups, and a (Q+r) number of memory cells are connected to the remaining one group, and when the number Q is an even number, a (Q−1) number of memory cells are connected to a maximum natural number of groups not exceeding (N−1)/2; a (Q+1) number of memory cells are connected to a maximum natural number of groups not exceeding N/2; and a (Q+r) number of memory cells are connected to the remaining one group, among the N number of groups.

9. The semiconductor integrated circuit according to claim 1, further comprising a word-line driver circuit connected to the word line, wherein a memory cell connected to the sense amplifier of the first group is disposed on a side closer to the word-line driver circuit than a memory cell connected to the sense amplifier circuit of the second group.

* * * * *